(12) United States Patent  (10) Patent No.: US 7,759,690 B2
Miki et al.  (45) Date of Patent: Jul. 20, 2010

(54) GALLIUM NITRIDE-BASED COMPOUND SEMICONDUCTOR LIGHT-EMITTING DEVICE

(75) Inventors: Hisayuki Miki, Ichihara (JP); Hironao Shinohara, Ichihara (JP); Koji Kamei, Ichihara (JP)

(73) Assignee: Showa Denko K.K., Tokyo (JP)

( * ) Notice: Subject to any disclaimer, the term of this patent is extended or adjusted under 35 U.S.C. 154(b) by 233 days.

(21) Appl. No.: 11/994,549

(22) PCT Filed: Jun. 30, 2006

(86) PCT No.: PCT/JP2006/313515

§ 371 (c)(1),
(2), (4) Date: Jan. 3, 2008

(87) PCT Pub. No.: WO2007/004701

PCT Pub. Date: Jan. 11, 2007

(65) Prior Publication Data

US 2009/0078951 A1 Mar. 26, 2009

Related U.S. Application Data

(60) Provisional application No. 60/698,006, filed on Jul. 12, 2005.

(30) Foreign Application Priority Data

Jul. 4, 2005 (JP) ............................. 2005-195095

(51) Int. Cl.
*H01L 29/225* (2006.01)
*H01L 29/22* (2006.01)
*H01L 25/16* (2006.01)
*H01L 33/00* (2010.01)

(52) U.S. Cl. ............................. 257/97; 257/98; 257/94; 257/99; 257/E25.032; 257/E33.072

(58) Field of Classification Search .................. 257/94, 257/97, 98, 99, E25.032, E33.072
See application file for complete search history.

(56) References Cited

U.S. PATENT DOCUMENTS

| 6,172,382 | B1 * | 1/2001 | Nagahama et al. | 257/94 |
| 6,465,808 | B2 * | 10/2002 | Lin | 257/81 |
| 6,495,862 | B1 * | 12/2002 | Okazaki et al. | 257/103 |
| 6,727,518 | B2 | 4/2004 | Uemura et al. | |
| 6,831,300 | B2 | 12/2004 | Doi et al. | |
| 7,042,012 | B2 * | 5/2006 | Senda et al. | 257/79 |
| 7,102,175 | B2 * | 9/2006 | Orita | 257/97 |

(Continued)

FOREIGN PATENT DOCUMENTS

JP 2003-347584 A 12/2003

(Continued)

*Primary Examiner*—Luan C Thai
(74) *Attorney, Agent, or Firm*—Sughrue Mion, PLLC

(57) ABSTRACT

An object of the present invention is to provide a gallium nitride-based compound semiconductor light-emitting device having a reflective positive electrode configured to achieve excellent light extraction efficiency.

The inventive gallium nitride-based compound semiconductor light-emitting device has a gallium nitride-based compound semiconductor layer structure comprising an n-type semiconductor layer, a light-emitting layer and a p-type semiconductor layer, on a substrate, wherein a positive electrode provided on the p-type semiconductor layer is a reflective positive electrode comprising a transparent material layer and a reflective metal layer formed on the transparent material layer.

19 Claims, 8 Drawing Sheets

U.S. PATENT DOCUMENTS

| | | | |
|---|---|---|---|
| 7,154,125 B2 * | 12/2006 | Koide et al. | 257/95 |
| 7,244,957 B2 * | 7/2007 | Nakajo et al. | 257/13 |
| 7,358,539 B2 * | 4/2008 | Venugopalan et al. | 257/98 |
| 7,385,226 B2 * | 6/2008 | Ou et al. | 257/95 |
| 2002/0134986 A1 | 9/2002 | Kamemura et al. | |
| 2003/0183824 A1 | 10/2003 | Doi et al. | |
| 2004/0222434 A1 | 11/2004 | Uemura et al. | |
| 2005/0056855 A1 | 3/2005 | Lin et al. | |
| 2005/0247949 A1 | 11/2005 | Senda et al. | |

FOREIGN PATENT DOCUMENTS

| | | |
|---|---|---|
| JP | 2004-356237 A | 12/2004 |
| JP | 2005-39197 A | 2/2005 |
| JP | 2005-197289 A | 7/2005 |
| JP | 2005-347728 A | 12/2005 |
| KR | 1999-0088218 A | 12/1999 |
| TW | 374958 | 11/1999 |
| TW | 535301 | 6/2003 |
| TW | 535306 | 6/2003 |
| TW | 1220578 | 8/2004 |

* cited by examiner

STRIPE-SHAPED PROTRUSION

DOT-LIKE PROTRUSION

LATTICE-LIKE PROTRUSION

GALLIUM NITRIDE-BASED COMPOUND SEMICONDUCTOR LIGHT-EMITTING DEVICE

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/698, 006 filed on Jul. 12, 2005, pursuant to 35 U.S.C. §111(b).

TECHNICAL FIELD

The present invention relates to a gallium nitride-based compound semiconductor light-emitting device, and more particularly to a flip-chip type gallium nitride-based compound semiconductor light-emitting device having a reflective positive electrode configured to achieve excellent light extraction efficiency.

BACKGROUND ART

In recent years, GaN-based compound semiconductor materials have been attracting attention as semiconductor materials for short-wavelength light emitting devices. GaN-based compound semiconductors are fabricated on substrates of various kinds of oxides and III-V compounds, including single-crystal sapphire, by using such methods as metal-organic chemical vapor deposition (MOCVD) or molecular beam epitaxy (MBE).

One of the characteristics of GaN-based compound semiconductor materials is that current diffusion hardly occurs in lateral directions. As a result, the current is injected only into the semiconductor directly below the electrode, and the light emitted from the light-emitting layer is blocked by the electrode and cannot be extracted outside. One solution is to form the positive electrode of this type of device from a transparent electrode so that the light can be extracted through the positive electrode. Another solution is to employ a flip-chip design which uses a reflective positive electrode and allows the emitted light to be extracted through the substrate.

The positive electrode of a conventional flip-chip device is formed in a layered structure by combining a contact metal, such as Pt or Ni, and a reflective metal, such as Rh or Ag (for example, refer to Japanese Unexamined Patent Publication No. 2000-183400).

On the other hand, the external quantum efficiency of a light-emitting device is defined as the product of the light extraction efficiency and the internal quantum efficiency. The internal quantum efficiency indicates what percentage of the electric current energy injected into the device turns into light. The light extraction efficiency indicates what percentage of the light generated within the semiconductor crystal can be extracted outside.

In the solution that uses a transparent electrode, one technique employed to increase the efficiency of extracting light from the semiconductor crystal into the atmosphere is to form depressions/protrusions on the light extraction surface of the semiconductor. Methods such as dry etching, wet etching, dicing, scribing using a diamond stylus, and laser scribing can be employed to form depressions/protrusions on the semiconductor surface. However, when the semiconductor material is subjected to such processing, the semiconductor layer suffers damage because of the strain due to the processing; as a result, even if the light extraction efficiency is increased by such processing, the internal quantum efficiency decreases, ending up being unable to increase light emission intensity. Furthermore, there have also been cases where the light-emitting device breaks down due to leakage current, etc., leading to low production yields.

In view of the above situation, there is proposed a technique for enhancing the light extraction efficiency wherein a layer to be formed with the depressions/protrusions for increasing the light extraction efficiency is formed on the semiconductor layer (for example, refer to Japanese Unexamined Patent Publication No. 2000-196152). According to this technique, since the depressions/protrusions are formed, not on the semiconductor layer itself, but on the transparent material layer formed on the semiconductor layer, the light extraction efficiency can be increased without causing damage to the semiconductor. However, what is described in this Japanese Unexamined Patent Publication No. 2000-196152 is an invention that specifically concerns a device of the type that uses an optically transmissive electrode. This Japanese Unexamined Patent Publication No. 2000-196152 also discloses polycarbonate, silicon nitride, indium oxide, niobium oxide, antimony oxide, zirconium oxide, cerium oxide, titanium oxide, zinc sulfide, bismuth oxide, etc. as examples of the transparent material used to form the layer on which the depressions/protrusions are to be formed.

In the case of a thin-film layered structure such as a conventional semiconductor device, multiple reflections are one of the factors working to reduce the light extraction efficiency. That is, multiple reflections occur at such surfaces as the front and back surfaces of the substrate, the interface between layers having different dielectric constants, and the surface where a reflective film is formed, and the emitted light is attenuated as it travels through the transparent material, due to absorption in the material, etc.

In the case of a flip-chip, multiple reflections occur at the reflective electrode and the interface between the semiconductor and the substrate, and these multiple reflections reduce the light extraction efficiency. There is therefore a need to construct a structure that avoids such multiple reflections by forming depressions/protrusions on either one of the reflecting surfaces.

One method is to form depressions/protrusions on the interface between the substrate and the semiconductor by forming the depressions/protrusions on the substrate on which the crystal is to be grown (for example, refer to Japanese Unexamined Patent Publication No. 2002-164296). With this method, however, since the substrate on which the crystal is to be grown has to be formed with depressions/protrusions, it becomes difficult to form a clean mirror-like crystal film uniformly and stably within the wafer. Another method is to form depressions/protrusions on the reflective electrode surface (for example, refer to U.S. Pat. No. 6,563, 142). In the prior art flip-chip electrode, however, since either the contact metal is made to also serve as the reflective metal or the contact metal is extremely thin, the semiconductor surface has had to be processed in order to form the depressions/protrusions on the reflective electrode surface. As earlier described, if the semiconductor surface is subjected to such processing, the internal quantum efficiency degrades, and the light emission output cannot be increased as desired.

DISCLOSURE OF THE INVENTION

An object of the present invention is to solve the above problem and provide a gallium nitride-based compound semiconductor light-emitting device having a reflective positive electrode configured to achieve excellent light extraction efficiency.

In the present invention, the phrase "being transparent or optically transmissive" means being transmissive to light in the wavelength range of 300 nm to 600 nm.

The present invention provides the following:

(1) A gallium nitride-based compound semiconductor light-emitting device having a gallium nitride-based compound semiconductor layer structure comprising an n-type semiconductor layer, a light-emitting layer and a p-type semiconductor layer, on a substrate, wherein a positive electrode provided on the p-type semiconductor layer is a reflective positive electrode comprising a transparent material layer and a reflective metal layer formed on the transparent material layer.

(2) A gallium nitride-based compound semiconductor light-emitting device according to item (1), wherein the transparent material layer contains an electrically conductive material.

(3) A gallium nitride-based compound semiconductor light-emitting device according to item (1) or (2), wherein the transparent material layer contains an electrically nonconductive material.

(4) A gallium nitride-based compound semiconductor light-emitting device according to item (2), wherein the transparent material layer is in contact with the p-type semiconductor layer and functions as a positive electrode contact layer.

(5) A gallium nitride-based compound semiconductor light-emitting device according to any one of items (1) to (3), wherein a positive electrode contact layer is interposed between the transparent material layer and the p-type semiconductor layer.

(6) A gallium nitride-based compound semiconductor light-emitting device according to any one of items (2) to (5), wherein the transparent material layer is formed from at least one material selected from the group consisting of ITO, $TiO_2$, ZnO, ZnS, $Bi_2O_3$, MgO, ZnAlO, and $SnO_2$.

(7) A gallium nitride-based compound semiconductor light-emitting device according to item (6), wherein the transparent material layer is formed from at least one material selected from the group consisting of ITO, ZnO, MgO, ZnAlO, and $SnO_2$.

(8) A gallium nitride-based compound semiconductor light-emitting device according to any one of items (1) to (7), wherein the reflective metal layer is formed from at least one kind of metal selected from the group consisting of Ag, Al, Fe, Cr, Ti, Co, Ni, Pd, Os, Ru, Pt, Rh, and Ir, or from an alloy containing at least one of these metals.

(9) A gallium nitride-based compound semiconductor light-emitting device according to item (8), wherein the reflective metal layer is formed from at least one kind of metal selected from the group consisting of Ag, Al, Fe, Pt, Rh, and Ir, or from an alloy containing at least one of these metals.

(10) A gallium nitride-based compound semiconductor light-emitting device according to item (9), wherein the reflective metal layer is formed from at least one kind of metal selected between Ag and Al, or from an alloy containing at least either one of these metals.

(11) A gallium nitride-based compound semiconductor light-emitting device according to any one of items (1) to (10), wherein the reflective metal layer is formed with depressions/protrusions on a surface thereof that faces the transparent material layer.

(12) A gallium nitride-based compound semiconductor light-emitting device according to item (11), wherein the transparent material layer is formed with depressions/protrusions on a surface thereof that faces the reflective metal layer.

(13) A gallium nitride-based compound semiconductor light-emitting device according to item (11) or (12), wherein the depressions/protrusions are formed in a stripe pattern.

(14) A gallium nitride-based compound semiconductor light-emitting device according to item (11) or (12), wherein the depressions/protrusions are formed in a dot-like or lattice-like pattern.

(15) A gallium nitride-based compound semiconductor light-emitting device according to item (11) or (12), wherein the depressions/protrusions are formed in random shapes.

(16) A gallium nitride-based compound semiconductor light-emitting device according to any one of items (11) to (15), wherein the depressions/protrusions are formed from curved surface.

(17) A gallium nitride-based compound semiconductor light-emitting device according to any one of items (11) to (15), wherein the depressions/protrusions are formed from plane surface slanted relative to a substrate surface.

(18) A gallium nitride-based compound semiconductor light-emitting device according to item (17), wherein the slanted plane surface makes angles of 5 to 85 degrees relative to the substrate surface.

(19) A gallium nitride-based compound semiconductor light-emitting device according to any one of items (11) to (18), wherein the depressions/protrusions have height differences of 0.01 μm to 10 μm.

(20) A lamp comprising a gallium nitride-based compound semiconductor light-emitting device according to any one of items (1) to (19).

The gallium nitride-based compound semiconductor light-emitting device of the present invention achieves an extremely large light emission output, because the semiconductor layer has a good crystallinity and because the device has excellent light extraction efficiency, allowing the light emitted from the light-emitting layer to be efficiently extracted outside without undergoing multiple reflections within the device.

BEST MODE FOR CARRYING OUT THE INVENTION

A gallium nitride-based compound semiconductor light-emitting device according to the present invention has a flip-chip type device structure, and its positive electrode comprises a transparent material layer and a reflective metal layer. An electrically conductive transparent oxide, such as ITO or ZnO, can be used for the transparent material layer. Alternatively, an electrically nonconductive transparent material, such as $SiO_2$ or SiN, may be used for the transparent material layer. In the latter case, it is essential that a positive electrode contact layer which electrically contacts the semiconductor be formed in contact with the semiconductor.

The reflective metal layer is formed on the surface of the transparent material layer opposite from the semiconductor, and the light reflecting surface of the reflective metal layer has depressions/protrusions because of the depressions/protrusions formed on the matching surface of the transparent material layer. That is, the depressions/protrusions are not formed directly on the semiconductor layer, but formed on the transparent material layer deposited on the semiconductor layer or the positive electrode contact layer, and the reflective metal layer is formed on the thus processed transparent material layer; with this structure, it becomes possible to increase the light extraction efficiency without degrading the internal quantum efficiency.

The transparent material layer formed with the depressions/protrusions can be made to also serve as the positive electrode contact layer. What is important is that the transparent material layer have sufficient optical transmissivity, have a certain amount of thickness, and be formed to have such a geometric pattern as to be able to avoid multiple reflections. It is desirable that the transparent material layer have a thickness in the range of 50 nm to 10 μm.

The term "transparent" or "optically transmissive" used in this specification does not necessarily mean that the material has an optical transmissivity of 100% in the entire wavelength range, but means that the material has an ability to transmit the light generated within the semiconductor to the outside world. Accordingly, the above term is used for a film fabricated by controlling the material and the thickness so that the film has an optical transmissivity of 50% or higher to the emission wavelength.

Figure 1:
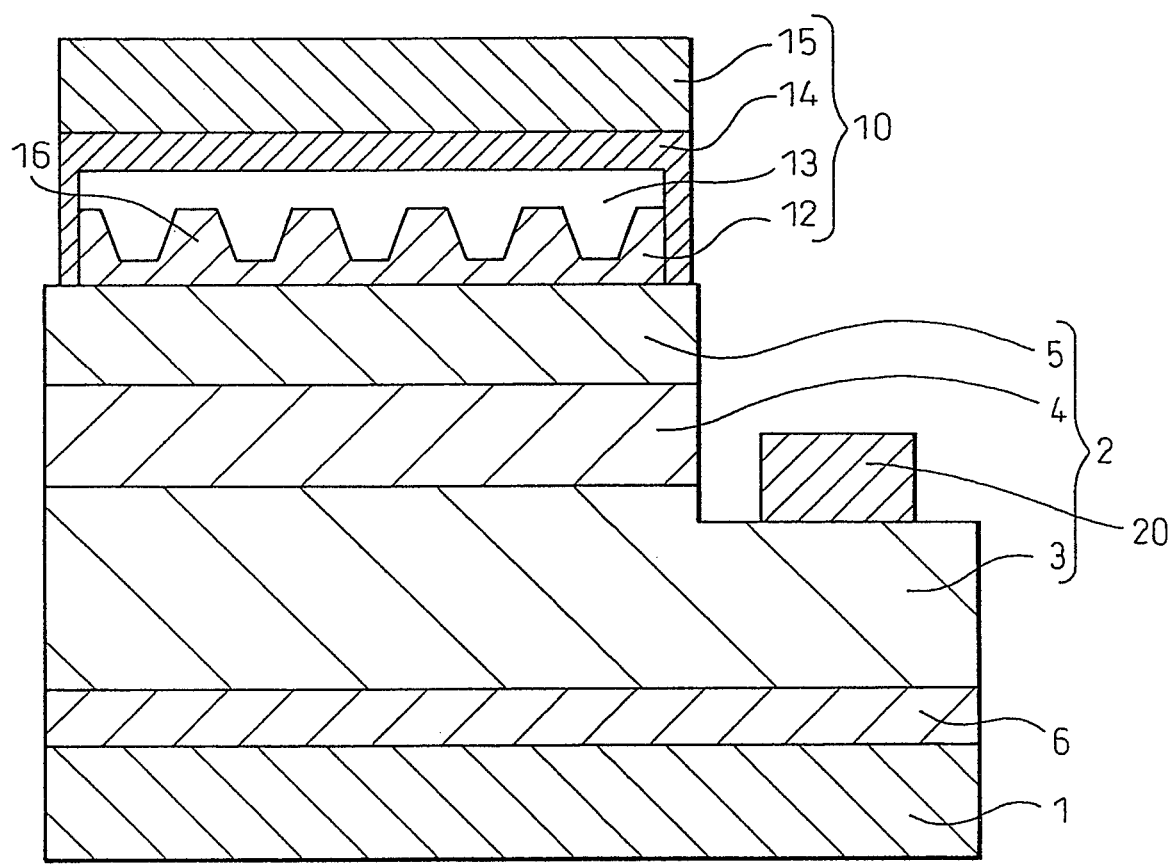
FIG. 1 is a schematic diagram showing a cross section of a gallium nitride-based compound semiconductor light-emitting device of the present invention fabricated in the example 1.

FIG. 1 is a schematic diagram showing a cross section of the flip-chip type gallium nitride-based compound semiconductor light-emitting device of the present invention fabricated in a first example. Reference numeral 10 is the positive electrode for the flip-chip, and comprises a transparent material layer 12 which also serves as a positive electrode contact layer, a reflective metal layer 13, an overcoat layer 14, and a bonding layer 15. Depressions/protrusions are formed on the uppermost surface of the transparent material layer 12 which is formed from a conductive transparent material (ITO in the first example) and which also serves as the positive electrode contact layer. Reference numeral 1 is a substrate. Reference numeral 2 is a GaN-based compound semiconductor layer, which comprises an n-type semiconductor layer 3, a light-emitting layer 4, and a p-type semiconductor layer 5. Reference numeral 6 is a buffer layer, and 20 is a negative electrode.

Any kind of conductive transparent material can be used for the transparent material layer 12. For example, the materials listed in the previously cited Japanese Unexamined Patent Publication No. 2000-196152 may be used (the Japanese Unexamined Patent Publication No. 2000-196152 discloses polycarbonate, silicon nitride, indium oxide, niobium oxide, antimony oxide, zirconium oxide, cerium oxide, titanium oxide, zinc sulfide, bismuth oxide, etc. as examples of the transparent material used to form the layer on which the depressions/protrusions are to be formed). Among others, transparent materials having high electrical conductivity, such as ITO, $TiO_2$, ZnO, ZnS, $Bi_2O_3$, MgO, ZnAlO, and $SnO_2$, are desirable. Of these, ITO, ZnO, MgO, ZnAlO, and $SnO_2$ are more preferable. In particular, ITO and ZnO are materials having excellent transparency and conductivity and inexpensive, and are therefore suitable for use in the present invention.

Preferably, the thickness of the transparent material layer is in the range of 50 nm to 10 μm. If the thickness is less than 50 nm, depressions/protrusions effective to increase the light extraction efficiency cannot be formed. If the thickness is greater than 10 μm, the optical transmissivity may significantly drop, resulting in a decrease in light emission output. The thickness in the range of 100 nm to 5 μm is further preferable.

Figure 11:
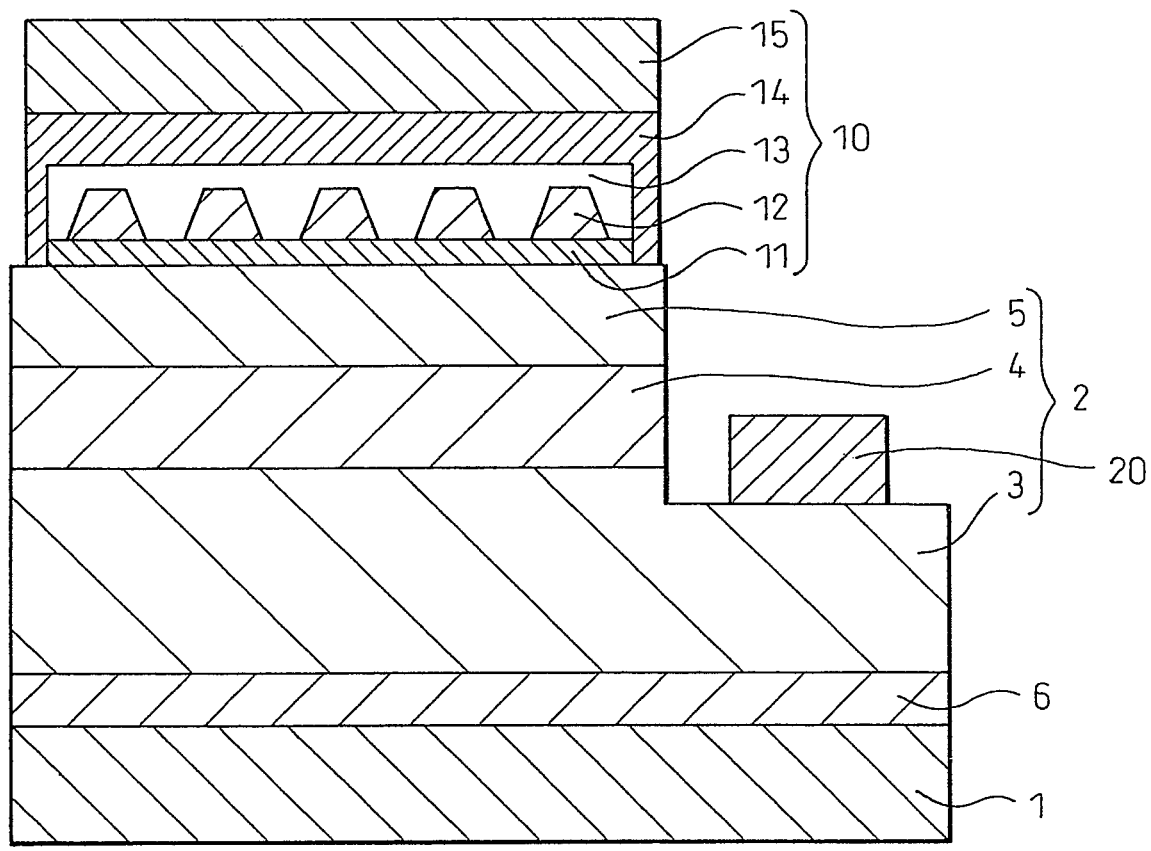
FIG. 11 is a schematic diagram showing a cross section of the gallium nitride-based compound semiconductor light-emitting device of the present invention fabricated in the example 2.

FIG. 11 is a schematic diagram showing a cross section of the gallium nitride-based compound semiconductor light-emitting device fabricated in a second example in which the transparent material layer was formed from a nonconductive material. As in the case of FIG. 1, reference numeral 10 is the positive electrode, which comprises a positive electrode contact layer 11, transparent material layer 12, reflective metal layer 13, overcoat layer 14, and bonding layer 15. Reference numeral 1 is the substrate. Reference numeral 2 is the GaN-based compound semiconductor layer, which comprises the n-type semiconductor layer 3, light-emitting layer 4, and p-type semiconductor layer 5. Reference numeral 6 is the buffer layer, and 20 is the negative electrode. Depressions/protrusions are formed on the uppermost surface of the transparent material layer 12.

As shown in FIG. 11, when the transparent material layer 12 is formed from a nonconductive material, the provision of the positive electrode contact layer 11 formed from a conductive transparent material is essential. From the standpoint of reducing the drive voltage, it is desirable that the transparent material layer not be formed as a continuous layer, but be formed with portions thereof removed so as to expose the underlying positive electrode contact layer 11 which is thus made to contact the overlying reflective metal layer 13. That is, in order to enable the current injected into the electrode from the bonding layer 15 to flow uniformly through the positive electrode contact layer 11, it is desirable that the transparent material layer 12 made of an insulating material be not formed over the entire surface of the positive electrode contact layer 11 but be formed so as to allow the reflective metal layer 13 to contact the positive electrode contact layer 11 here and there.

Any kind of nonconductive transparent material can be used for the transparent material layer. For example, the materials listed in the previously cited Japanese Unexamined Patent Publication No. 2000-196152 may be used. Among others, transparent materials having low electrical conductivity, such as $SiO_2$, $Si_3N_4$, and $CaF_2$, are preferable.

Generally, high-transparency materials are often electrically nonconductive, and when it is desired to use such material, the light emission output can be increased by providing the positive electrode contact layer.

As in the case of the conductive transparent material layer, the thickness of the nonconductive transparent material layer is preferably in the range of 10 nm to 10 µm. If the thickness is less than 10 nm, depressions/protrusions effective to increase the light extraction efficiency cannot be formed. If the thickness is greater than 10 µm, the optical transmissivity may significantly drop, resulting in a decrease in light emission output. The thickness in the range of 100 nm to 5 µm is further preferable.

The depressions/protrusions can be formed on the surface of the transparent material layer in several ways: in one method, after forming the transparent material layer having a planar surface, depressions are formed by removing selected portions of the transparent material layer, and in another method, protrusions are formed by forming optically transmissive films on selected portions of the transparent material layer. Alternatively, the depressions/protrusions may be formed by controlling the formation conditions when forming the transparent material layer. Of these methods, the method of forming depressions by removing selected portions of the planar transparent material layer is preferable because, with this method, it is easy to control the surface geometry.

In the present invention, the depressions/protrusions may be formed only from surfaces perpendicular to the substrate surface, or may be formed from plane surfaces slanted relative to the substrate surface. The effect of avoiding multiple reflections is greater when the surface contains depressions/protrusions formed from plane surfaces slanted relative to the substrate surface. The phrase "depressions/protrusions formed from plane faces slanted relative to the substrate surface" means that at least some of the surface portions of the transparent material layer forming the depressions or protrusions are formed as plane surfaces slanted relative to the substrate surface.

Figure 4:
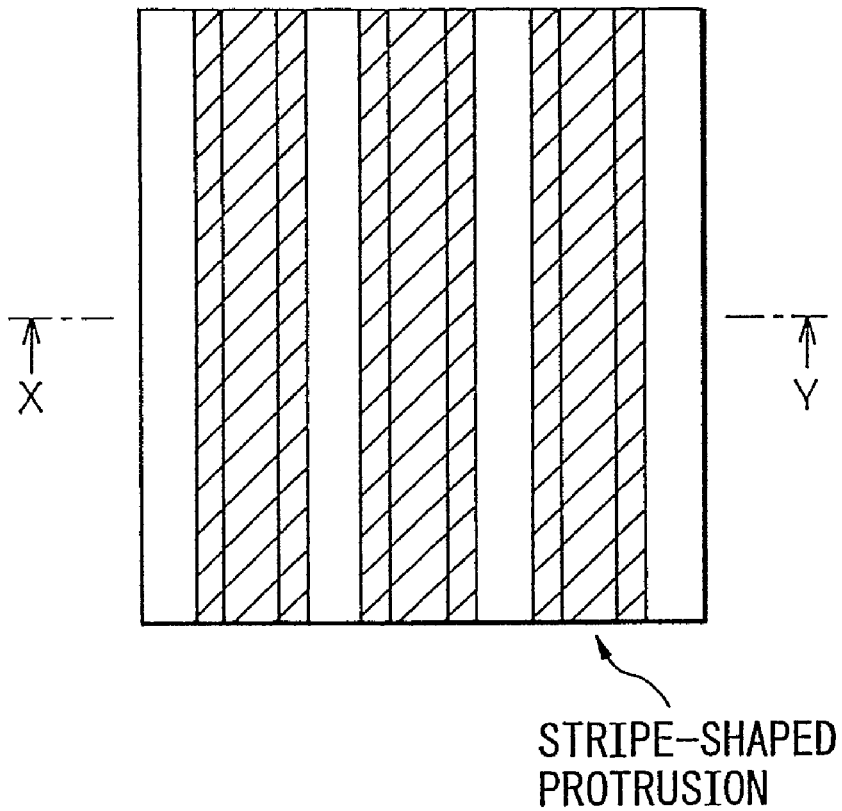
FIG. 4 is a plan view showing one example of a pattern of depressions/protrusions formed on the surface of the transparent material layer.
Figure 5:
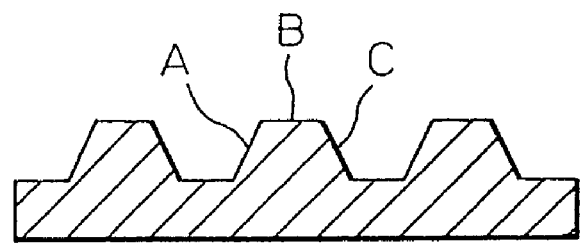
FIG. 5 is a cross-sectional view taken along line X-Y in FIG. 4.

For example, consider the case where the depressions/protrusions on the transparent material layer are formed as stripe-shaped protrusions as shown in FIG. 4 (plan view) and FIG. 5 (cross-sectional view taken along X-Y in FIG. 4); in the case of this transparent material layer, of the surface portions A, B, and C forming each protrusion, the portions A and C are formed as plane faces slanted relative to the substrate surface. Of course, each protrusion may be formed only from the faces A and C by eliminating the face B parallel to the substrate surface, and one or the other of the faces A and C may be formed perpendicular to the substrate surface. From the standpoint of effectively avoiding multiple reflections and enhancing the light extraction efficiency, it is desirable to form each protrusion only from plane faces slanted relative to the substrate surface.

Preferably, the angle of each plane face slanted relative to the substrate surface is in the range of 5 to 85 degrees relative to the substrate surface. If the slant angle is smaller than 5 degrees or larger than 85 degrees, it is difficult to increase the light extraction efficiency. Preferably, the slant angle is in the range of 15 to 75 degrees, and more preferably in the range of 30 to 60 degrees.

The depressions/protrusions on the surface of the transparent material layer can be formed in any suitable pattern. Among others, the stripe pattern described above is desirable from the viewpoint of ease of formation. In this case, the maximum width of the stripe-shaped depression or protrusion is preferably in the range of 1 µm to 500 µm. If it is smaller than 1 µm, the pattern becomes difficult to form, and if it is larger than 500 µm, a sufficient number of stripes cannot be formed within each chip surface. Further preferably, the width is in the range of 10 µm to 100 µm. Preferably, the stripes are formed at a pitch of 1 µm to 500 µm. If it is smaller than 1 µm, the pattern becomes difficult to form, and if it is larger than 500 µm, a sufficient number of stripes cannot be formed within each chip surface. More preferably, the pitch is in the range of 10 µm to 100 µm.

Figure 6:
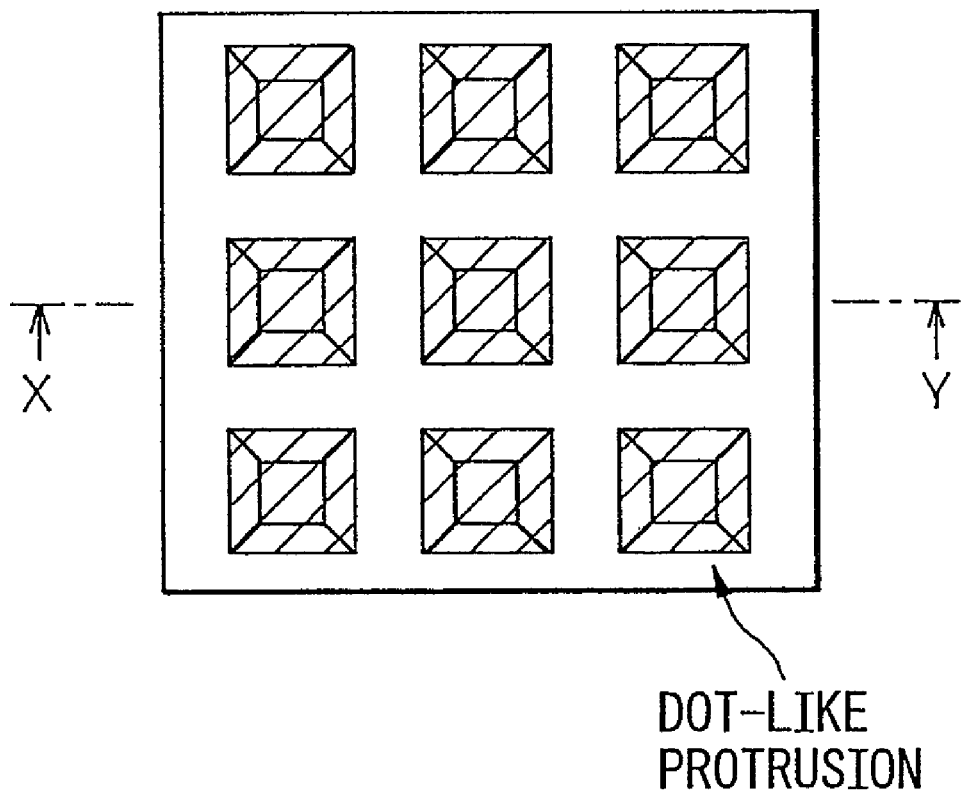
FIG. 6 is a plan view showing another example of a pattern of depressions/protrusions formed on the surface of the transparent material layer.
Figure 7:
FIG. 7 is a cross-sectional view taken along line X-Y in FIG. 6.

On the other hand, forming the depressions/protrusions as dot-like protrusions as shown in FIG. 6 (plan view) and FIG. 7 (cross-sectional view taken along X-Y in FIG. 6) is preferable from the viewpoint of uniform light distribution, because this pattern not only can effectively avoid multiple reflections, but enables the light to be extracted equally from any direction around the light-emitting device. The stripe pattern described above is inferior to the dot pattern in uniform light distribution because, in the stripe pattern, the intensity of extracted light in the direction parallel to the stripe differs from that in the direction at right angles to it.

The maximum width/length of each dot-like protrusion is preferably in the range of 1 µm to 500 µm. If it is smaller than 1 µm, the dot pattern becomes difficult to form, and if it is larger than 500 µm, a sufficient number of dots cannot be formed within each chip surface. Further preferably, the width/length is in the range of 10 µm to 100 µm. Preferably, the dots are formed at a pitch of 1 µm to 500 µm. If it is smaller than 1 µm, the pattern becomes difficult to form, and if it is larger than 500 µm, a sufficient number of dots cannot be formed within each chip surface. More preferably, the pitch is in the range of 10 µm to 100 µm.

Figure 8:
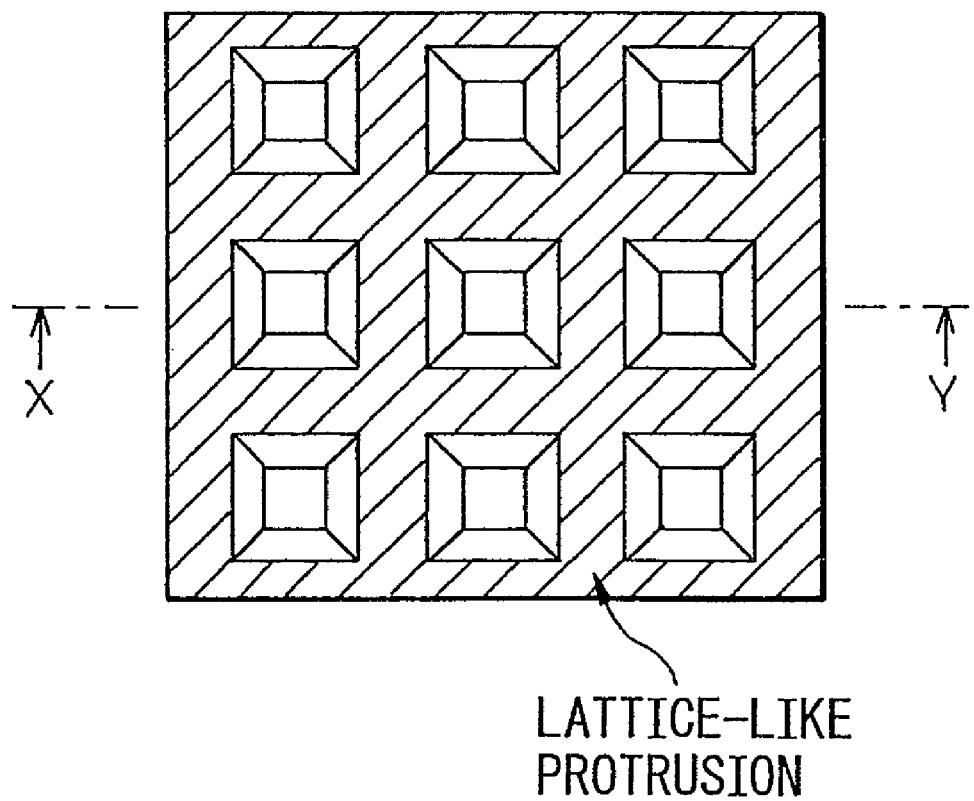
FIG. 8 is a plan view showing another example of a pattern of depressions/protrusions formed on the surface of the transparent material layer.
Figure 9:
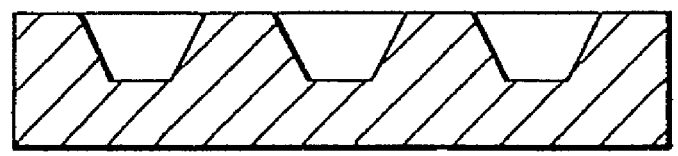
FIG. 9 is a cross-sectional view taken along line X-Y in FIG. 8.

Further, forming the depressions/protrusions as protrusions in a lattice-like pattern as shown in FIG. 8 (plan view) and FIG. 9 (cross-sectional view taken along X-Y in FIG. 8) is most desirable, because multiple reflections can be effectively avoided and because ease of formation of the depressions/protrusion pattern and uniform light distribution can be achieved at the same time. In this case, the maximum width of each protrusion is preferably in the range of 1 µm to 500 µm. If it is smaller than 1 µm, the pattern becomes difficult to form, and if it is larger than 500 µm, a sufficient number of protrusions cannot be formed within each chip surface. More preferably, the width is in the range of 10 µm to 100 µm. Preferably, the protrusions are formed at a pitch of 1 µm to 500 µm. If it is smaller than 1 µm, the pattern becomes difficult to form, and if it is larger than 500 µm, a sufficient number of protrusions cannot be formed within each chip surface. Further preferably, the pitch is in the range of 10 µm to 100 µm.

The depressions/protrusions on the transparent material layer may be formed in random shapes. In this case, depressions/protrusions varying in size, width, depth, slant angle, etc. are formed. Such depressions or protrusions have varying shapes when viewed from the top.

Such random shapes can be formed by controlling the film formation conditions as in the earlier described method, or by randomly processing the uppermost surface by such means as dry etching or wet etching.

The depressions/protrusions on the transparent material layer can each be formed to have any suitable cross-sectional shape. A triangular shape or a V shape, formed from sides with a single angle, is the most commonly employed shape, but alternatively, a pentagonal shape formed from sides with two kinds of angles or a heptagonal shape formed from sides with three kinds of angles may be employed. However, the shape whose cross section is formed with multiple kinds of angles is difficult to form, and often leads to the problem of decreased production yields. The most effective shape is the triangular shape or the V shape. A trapezoidal shape having a side parallel to the substrate surface may be employed by cutting off the upper portion of the triangle or the letter V.

The depressions/protrusions on the transparent material layer may each be formed to have a cross-sectional shape containing a curved surface. In this case, depressions/protrusions varying in size, width, depth, slant angle, etc. may be formed as long as the cross-sectional shape contains a curved surface. Among others, shapes such as lens-like shapes and spherical shapes that are formed only from curved surfaces are most desirable from the standpoint of preventing multiple reflections.

Further, the height difference between the depressions/protrusions should be determined arbitrarily within the thickness of the transparent material layer; preferably, the height difference is in the range of 10 nm to 10 µm, and more preferably in the range of 100 nm to 5 µm, and still more preferably in the range of 200 nm to 1 µm. If it is less than 10 nm, the light extraction efficiency cannot be improved sufficiently. On the other hand, if the height difference is too great, the processing cost increases.

The processing for forming the depressions/protrusions on the surface of the transparent material layer is not limited to any specific method, but any suitable method may be used. In one method, for example, the layer is patterned using a technique known as photolithography, and thereafter, depressions are formed by dry etching or wet etching, while forming remaining portions as protrusions. It is also possible to employ a technique of scribing that draws lines by pressing a diamond stylus on the surface or a technique of laser scribing that performs processing with the heat generated by applying laser light.

One example of the method of forming lattice-like depressions/protrusions having slanted surfaces will be described below. Any of the known techniques described above may be employed for the method of depression/protrusion formation, and the method is not limited to any one of the examples described below.

First, a conductive transparent material, for example, an ITO film, is formed to a uniform thickness on the p-type semiconductor layer in the gallium nitride-based compound semiconductor layer structure. Then, a resist is applied over the entire surface, and the resist is exposed in the desired pattern. Here, non-coherent light is used as the exposure light. In the case of non-coherent light, a small amount of light can enter the inside from the edges of the pattern and, using this phenomenon, the pattern edges of the resist film can be formed in tapered shape. The non-coherent light can be produced by shifting the position of the light source of the exposure device or the position of the sample and thereby causing an "out of focus" condition.

In an alternative method, the resist is applied to a thickness greater than usual, as a result of which the amount of light falling on the resist is reduced at the pattern edges which are thus formed in tapered shape. The same result can also be achieved by reducing the amount of exposure light or by shortening the exposure time.

Figure 10:
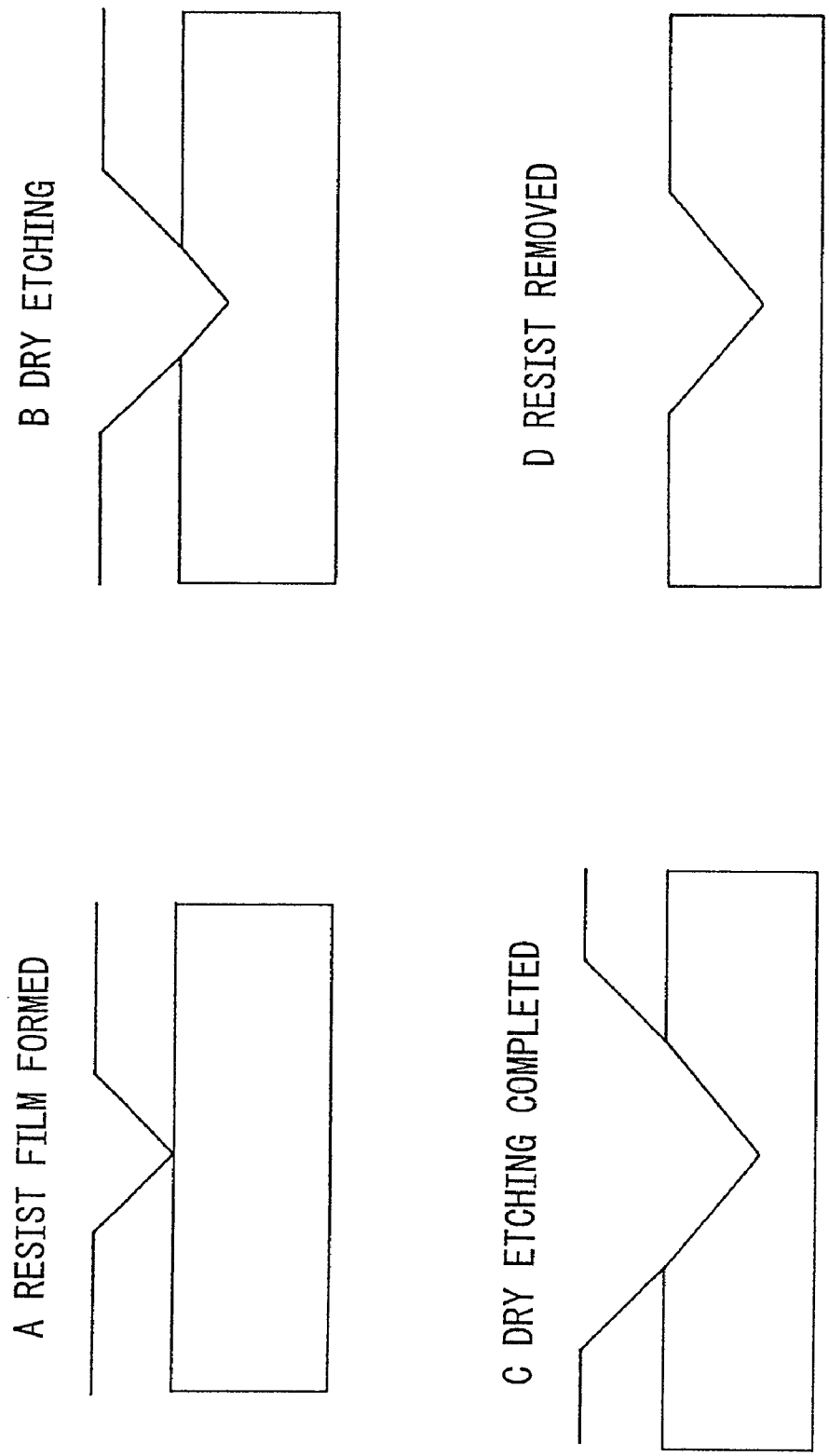
FIG. 10 is a schematic diagram showing a process sequence for dry etching using a tapered resist.

When dry etching is applied by using as a protective film the resist film whose pattern edges are tapered, since the thickness of the resist film is also reduced by the etching, the edges of the resulting depressions are also formed in tapered shape. The processing steps are shown in time sequence in FIG. 10. With such methods, depressions (or protrusions when viewed in terms of portions left unremoved) having plane surfaces slanted relative to the substrate surface can be formed.

Likewise, the pattern can also be formed by wet etching by using the resist film as a protective film. A known etching solution that matches the material to be patterned can be selected for the wet etching.

Depressions/protrusions can also be formed using a technique known as scribing. That is, by scribing the surface of the transparent material layer, such as an ITO or $SiO_2$ film, in horizontal and/or vertical directions using a diamond stylus having a desired tapered tip, V-shaped depressions can be formed, for example, in a stripe or lattice-like pattern (or stripe or dot-like protrusions when viewed in terms of portions left unremoved) on the surface of the transparent material layer.

Depressions/protrusions of such patterns can also be formed by using a technique known as laser scribing which cuts grooves by melting the surface of the transparent material layer by laser radiation.

The reflective metal layer is formed over the transparent material layer. As a result, at least the surface of the reflective metal layer that faces the transparent material layer is formed with depressions/protrusions like those formed on the transparent material layer. Since the light from the light-emitting layer is reflected by the surface formed with such depression or protrusion, multiple reflections can be prevented.

Any kind metal having high reflectivity can be used for the reflective metal layer. It is also required that the metal have good adhesion with the transparent material formed in the above manner. Here, metals having good reflectivity refer to metals whose reflectivity is 80% or higher. Preferably, the reflective metal layer is formed from at least one kind of metal selected from the group consisting of Ag, Al, Fe, Cr, Ti, Co, Ni, Pd, Os, Ru, Pt, Rh, and Ir, or from an alloy containing at least one of these metals. Among others, at least one kind of metal selected from the group consisting of Ag, Al, Fe, Pt, Rh, and Ir or an alloy containing at least one of these metals is preferable. Of these, Ag or Al or an alloy containing at least either one of them is particularly preferable.

It is desirable that the reflective metal layer be formed so as to cover the entire surface of the transparent material layer formed in the above manner, and for that purpose, it is desired that the reflective metal layer have a certain amount of thickness. More specifically, it is desirable that the thickness be 10 nm or greater, and it is further desirable that the thickness be 50 nm or greater. However, if the layer is formed too thick, the processing time increases unnecessarily; therefore, it is preferable to make the thickness not greater than 100 µm. More preferably, the thickness is not greater than 10 µm.

When a metal such as Ag that is prone to electromigration is used for the reflective metal layer, it is preferable to form an overcoat layer over the reflective metal layer. It is desirable that the overcoat layer be one size larger than the reflective metal layer and be formed in such a manner as to completely shroud the reflective metal layer. The overcoat layer may be formed from any suitable material as long as the material can prevent electromigration. It is preferable to use an electrically conductive material such as Rh or Pt. A nonconductive material such as $SiO_2$ may be used, but in that case, it is required that the overcoat layer be formed partially from a metal to provide an electrical contact between the overlying bonding layer and the underlying reflective metal layer, or that the bonding layer and the metal reflective layer be made to contact each other in a manner that does not affect the electromigration.

In the positive electrode according to the present invention, a transparent positive electrode contact layer made of an electrically conductive material may be formed in contact with the semiconductor (p-type semiconductor layer) surface in order to provide an electrical contact between the transparent material layer and the semiconductor. As earlier noted, when the transparent material layer is formed from an electrically nonconductive material, the provision of the positive electrode contact layer is essential. The characteristics required of the positive electrode contact layer are good optical transmissivity and low contact resistance to the p-type semiconductor layer.

Any of the conductive transparent materials previously mentioned for the formation of the conductive transparent material layer can be used as the material for the positive electrode contact layer. However, from the viewpoint of the contact resistance to the p-type semiconductor layer, metals, such as nickel (Ni), gold (Au), platinum (Pt), ruthenium (Ru), osmium (Os), rhodium (Rh), iridium (Ir), palladium (Pd), cobalt (Co), and chromium (Cr), or their alloys are preferable. Of these, Pt is particularly preferable, because its work function is high and a good ohmic contact with the p-type GaN-based compound semiconductor layer can be obtained without applying high-temperature heat treatment.

When any one of the above metals is used for the positive electrode contact layer, the film thickness is preferably held within the range of 0.1 nm to 7.5 nm. If the thickness is less than 0.1 nm, it is difficult to form a stable thin film. If the thickness exceeds 7.5 nm, the optical transmissivity drops. The thickness in the range of 0.1 nm to 5 nm is more preferable. When the stability of the film formation and the decrease of the transmissivity due to the subsequent formation of the transparent material layer are considered, the thickness in the range of 0.5 nm to 2.5 nm is particularly preferable.

Further, the positive electrode contact layer can be formed in a lattice-like pattern or in the form of scattered islands by ball-up. By thus forming thin regions and thick regions in the positive electrode contact layer, thin regions having higher optical transmissivity can be formed.

The bonding layer for connecting to a current flowing circuit such as a wire, leadframe, or submount can be formed on top of the reflective metal layer or the overcoat layer.

For the construction of the bonding layer, various known materials and structures can be used without any restrictions. However, it is desirable to use a material having good adhesion with the reflective metal layer or the overcoat layer, and the thickness must be sufficiently large so that damage will not be caused to the electrode or the semiconductor layer by the stress occurring at the time of bonding. It is also desirable to form the uppermost layer from a material having good adhesion with the material to be connected thereto. An example is Au.

It is desirable that the depressions/protrusions formed on the transparent material layer not show on the uppermost surface of the bonding layer. Since the depressions/protrusions can be made less noticeable by increasing the thickness of the bonding layer, it is desirable that the bonding layer be formed, for example, as thick as or thicker than 400 nm.

However, if the depressions/protrusions slightly show on the surface of the bonding layer, it is still possible to make connections depending on the conditions and the method used; therefore, the occurrence of such depressions/protrusions on the surface does not necessarily represent a defect.

The film formation method for forming the positive electrode contact layer, the transparent material layer, the reflective metal layer, the overcoat layer, and the bonding layer is not limited to any particular method, but known vacuum evaporation methods and sputtering methods can be used. Vacuum evaporation involves the use of a heating method such as a resistive heating method or an electron heating method, of which the electron heating method is suitable for the evaporation of materials other than metals. Alternatively, the compound as the source material may be prepared in the form of a liquid, and this liquid material may be applied over the surface and then treated by a suitable method to form an oxide film. It is also possible to form a metal film first, and then oxidize it to form an oxide material film.

Various layer structures, each constructed by forming on a substrate a gallium nitride-based compound semiconductor layer on which a positive electrode is formed, as described above, are known in the prior art, including the layer structure shown in FIG. 1 in which the gallium nitride-based compound semiconductor layer comprising the n-type semiconductor layer, light-emitting layer, and p-type semiconductor layer is formed on the substrate by interposing the buffer layer therebetween, and any gallium nitride-based compound semiconductor layer structure suitable for a light-emitting device, including the known gallium nitride-based compound semiconductor layer structures, can be used without any restrictions.

For the substrate, known substrate materials can be used without any restrictions, examples including: an oxide single crystal such as a sapphire single crystal ($Al_2O_3$; A-plane, C-plane, M-plane, R-plane), a spinel single crystal ($MgAl_2O_4$), a ZnO single crystal, a $LiAlO_2$ single crystal, $LiGaO_2$ single crystal, a MgO single crystal, and a $Ga_2O_3$ single crystal; a Si single crystal; a SiC single crystal; a GaAs single crystal; an AlN single crystal; a GaN single crystal; and a boride single crystal such as $ZrB_2$. If it is desired to extract light through the substrate, the substrate must be formed from a transparent material, but since the device can be constructed as a flip-chip device by separating the substrate, the substrate need not necessarily be transparent. The plane orientation of the substrate is not limited to any specific direction. Further, the substrate may be a just-oriented substrate or an off-angled substrate.

Depressions/protrusions for enhancing the light extraction efficiency can also be formed on the substrate.

In one method, depressions/protrusions are formed in advance on the surface on which the crystal is to be grown, and the semiconductor crystal is fabricated on that surface. In this case, it is difficult to obtain clean mirror-like crystal faces, but if good crystal faces can be obtained, a further increase in light extraction efficiency can be achieved by the synergy with the depressions/protrusions formed on the reflecting surface of the reflective electrode.

Depressions/protrusions may also be formed on the back surface of the substrate (the back surface is the light extraction surface when the device is constructed as a flip-chip). In this case also, handling is difficult, and the fabrication yield may drop, but a further increase in light extraction efficiency can be achieved by the synergy with the depressions/protrusions formed on the reflecting surface of the reflective electrode.

For the construction of the n-type semiconductor layer, the light-emitting layer, and the p-type semiconductor layer, there are various known structures which can be used without any restrictions.

For the gallium nitride-based compound semiconductor used to form these layers, semiconductors of various compositions, represented by the general formula $Al_xIn_yGa_{1-x-y}N$ ($0 \leq x<1$, $0 \leq y<1$, $0 \leq x+y<1$), are known, and any of the semiconductors of various compositions, represented by the general formula $Al_xIn_yGa_{1-x-y}N$ ($0 \leq x<1$, $0 \leq y<1$, $0 \leq x+y<1$), including the known ones, can be used without any restrictions as the gallium nitride-based compound semiconductor for forming the n-type semiconductor layer, the light-emitting layer, and the p-type semiconductor layer in the present invention.

The method for growing such gallium nitride-based compound semiconductors is not specifically limited, and any known method for growing III nitride semiconductors, such as MOCVD (Metal Organic Chemical Vapor Deposition), HVPE (Hydride Vapor Phase Epitaxy), and MBE (Molecular Beam Epitaxy), can be used. MOCVD is the preferred growth method from the viewpoint of the controllability of the film thickness and mass-producibility. In the MOCVD method, hydrogen ($H_2$) or nitrogen ($N_2$) is used as the carrier gas, and trimethylgallium (TMG) or triethylgallium (TEG), trimethylaluminum (TMA) or triethylaluminum (TEA), and trimethylindium (TMI) or triethylindium (TEI) are used as the Ga source, the Al source, and the In source, respectively, which are the source materials from group III, while ammonia ($NH_3$), hydrazine ($N_2H_4$), etc. are used as the N sources, the source materials from group V. As for the dopants, monosilane ($SiH_4$) or di-silane ($Si_2H_6$) as the Si source material and germane ($GeH_4$) or an organic germanium compound as the Ge source material are used for the n-type, and bis(cyclopentadienyl)magnesium ($Cp_2Mg$) or bis(ethylcyclopentadienyl)magnesium (($EtCp)_2Mg$), for example, is used as the Mg source material for the p-type.

To form the negative electrode in contact with the n-type semiconductor layer in the gallium nitride-based compound semiconductor fabricated by forming the n-type semiconductor layer, the light-emitting layer, and the p-type semiconductor layer in this order on the substrate, the light-emitting layer and the p-type semiconductor layer are partially removed to expose the underlying n-type semiconductor layer. After that, the reflective positive electrode is formed on the unremoved region of the p-type semiconductor layer, and the negative electrode is formed on the exposed n-type semiconductor layer. Negative electrodes of various compositions and structures are known, and any of negative electrodes of various compositions and structures, including the known ones, can be used as the negative electrode without any restrictions.

EXAMPLES

Next, the present invention will be described in further detail with reference to examples, but it will be appreciated that the present invention is not limited to the examples described herein.

Example 1

Figure 2:
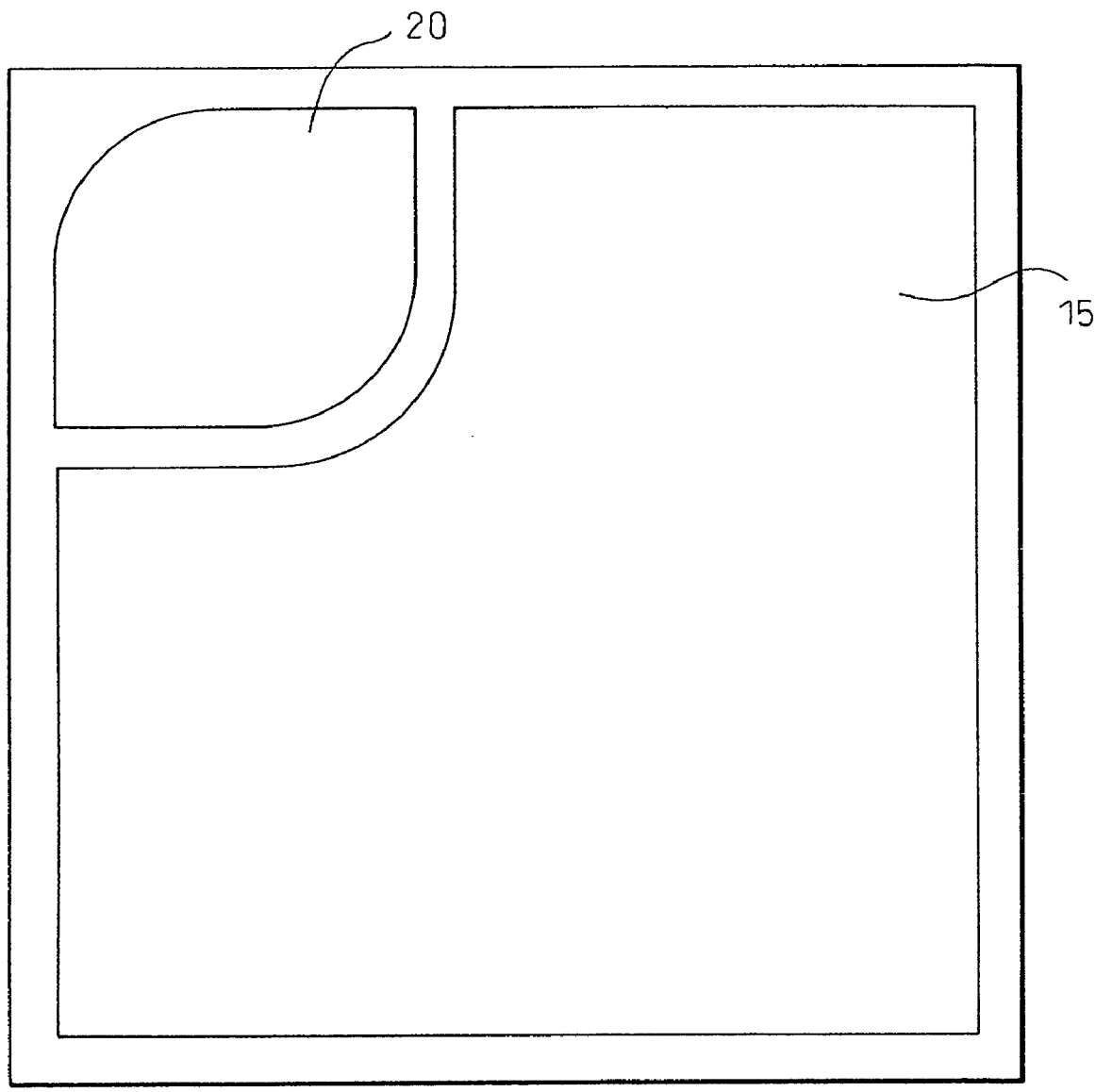
FIG. 2 is a schematic diagram showing a plan view of the gallium nitride-based compound semiconductor light-emitting device of the present invention fabricated in the examples 1 and 2.

FIG. 1 is a schematic diagram showing a cross section of the gallium nitride-based compound semiconductor light-emitting device fabricated in this example, and FIG. 2 is a schematic diagram showing a plan view of it. A gallium nitride-based compound semiconductor layer (2) was formed on a sapphire substrate (1) by interposing therebetween a buffer layer (6) of AlN. The gallium nitride-based compound semiconductor layer (2) comprises: an n-type semiconductor layer (3) formed by forming a 8-μm thick base layer of undoped GaN, a 2-μm thick, Ge-doped n-type GaN contact layer, and a 0.02-μm thick, Si-doped n-type $In_{0.1}Ga_{0.9}N$ clad layer in this order; a light-emitting layer (4) of a multiple quantum well structure constructed by stacking five 16-nm thick, Si-doped GaN barrier layers and five 2.5-nm thick, $In_{0.06}Ga_{0.94}N$ well layers in alternating fashion and finally forming a barrier layer on top of the uppermost well layer; and a p-type semiconductor layer (5) formed by forming a 0.01-μm thick, Mg-doped p-type $Al_{0.07}Ga_{0.93}N$ clad layer and a 0.18-μm thick, Mg-doped p-type $Al_{0.02}Ga_{0.98}N$ contact layer in this order. A positive electrode (1) was formed on the p-type AlGaN contact layer by forming thereon a transparent material layer (12) made of 500-nm thick ITO, a reflective metal layer (13) made of 100-nm thick Ag, an overcoat layer (14) made of 500-nm thick Rh, and a bonding layer (15) of a five-layer structure of Au, Ti, Al, Ti, and Au (with thicknesses 50 nm, 20 nm, 10 nm, 100 nm, and 200 nm, respectively). Protrusions (16) having slanted surfaces were formed in a dot-like pattern on the surface of the transparent material layer (12), as shown in the plan view of FIG. 3. A negative electrode (20) of a two-layer structure of Ti and Au was formed on the n-type GaN contact layer. The light extracting face was located on the substrate side.

In the above structure, the carrier concentration in the n-type GaN contact layer was $1 \times 10^{19}$ cm$^{-3}$, the concentration of Si doping in the n-type $In_{0.1}Ga_{0.9}N$ clad layer was $1 \times 10^{18}$ cm$^{-3}$, the concentration of Si doping in the GaN barrier layer was $1 \times 10^{17}$ cm$^{-3}$, the carrier concentration in the p-type AlGaN contact layer was $5 \times 10^{18}$ cm$^{-3}$, and the concentration of Mg doping in the p-type AlGaN clad layer was $5 \times 10^{19}$ cm$^{-3}$.

The layers (3 to 6 in FIG. 1) forming the gallium nitride-based compound semiconductor layer were formed by MOCVD under normal conditions well known in the related technical field. The positive and negative electrodes were fabricated in accordance with the following procedure.

First, the portion of the n-type GaN contact layer on which the negative electrode was to be formed was exposed by reactive ion etching in the following manner.

Next, an etching mask was formed on the p-type semiconductor layer. The sequence of processing is as follows. After applying a resist uniformly over the entire surface, the resist was removed from the positive electrode area by using a known lithographic technique. Then, the structure was placed in a vacuum evaporation chamber, and using an electron beam method, Ni and Ti were deposited to thicknesses of about 50 nm and 300 nm, respectively, under a pressure of $4 \times 10^{-4}$ Pa or lower. After that, using a lift-off technique, the metal layers and the resist were removed from all the areas except the positive electrode area.

Next, the substrate with the semiconductor layer fabricated thereon was placed on an electrode in an etching chamber of a reactive ion etching apparatus, and the etching chamber was evacuated to $10^{-4}$ Pa, after which $Cl_2$ as an etching gas was supplied and the etching was performed until the n-type GaN contact layer was exposed. After the etching, the substrate was retrieved from the reactive ion etching apparatus, and the etching mask was removed using nitric acid and hydrofluoric acid.

Next, using known photolithographic and lift-off techniques, the transparent material layer (12) of ITO was formed only on the area of the p-type AlGaN contact layer on which the positive electrode was to be formed. In forming the transparent material layer, the substrate was placed in a vacuum sputtering chamber, and an ITO film was deposited to a thickness of 500 nm.

After retrieving the substrate from the vacuum chamber, depressions/protrusions were formed on the surface of the transparent material layer.

First, using a known lithographic technique, a resist film was formed in a dot-like pattern on the transparent material layer. A positive resist in which the exposed areas dissolve when developed was used as the resist, and underexposed areas were created in the edge portions of the mask pattern by making the resist exposure time shorter than usual. By exposing this, a resist pattern having slanted edge surfaces was produced.

Dot-like protrusions having surfaces slanted relative to the substrate were formed by dry etching on the transparent material layer with the above-described resist pattern formed thereon. Each dot-like protrusion had a shape resembling a square pyramid with its vertex cut off, was trapezoidal in cross section, and had an upper surface 2 μm square and a lower surface 3 μm square. The height was about 290 nm, and the protrusions were formed at intervals of 5 μm in directions parallel to the sides of the chip. The angle that the slanted surfaces of each dot-like protrusion made with the substrate was about 30 degrees.

After that, processing was performed in accordance with a procedure generally known as lift-off; then, using a similar technique, the reflective metal layer (13) of Ag was formed in such a manner as to completely cover the transparent material layer. The reflective metal layer was formed to a thickness of 100 nm by using an evaporation device.

After that, processing was performed in accordance with a procedure generally known as lift-off, and the overcoat layer (14) of Rh was formed in such a manner as to completely shroud the reflective metal layer. The overcoat layer was formed to a thickness of 500 nm by using an evaporation device.

Subsequently, processing was performed in accordance with a procedure generally known as lift-off; then, using a similar technique, the bonding layer (15) was formed by forming a first layer made of Au, a second layer made of Ti, a third layer made of Al, a fourth layer made of Ti, and a fifth layer made of Au in the order stated on top of the overcoat layer. In this way, the positive electrode was formed on the p-type AlGaN contact layer. The bonding layer was formed by using an evaporation device.

Next, the negative electrode was formed on the exposed n-type GaN contact layer in accordance with the following procedure. After applying a resist uniformly over the entire surface, the resist was removed from the negative electrode area on the exposed n-type GaN contact layer by using a known lithographic technique; then, using the conventional vacuum evaporation method, the negative electrode was formed by depositing Ti and Au to thicknesses of 100 nm and 200 nm, respectively, in this order on the semiconductor. After that, the resist was removed using a known technique.

After the substrate thickness was reduced to 80 μm by grinding and polishing the back surface of the substrate, the wafer with the positive and negative electrodes formed thereon was scribed from the semiconductor layer side by using a laser scriber, and then stressed and broken apart, thereby separating individual chips each 350 μm square. When each chip was measured by flowing a current of 20 mA using a needle-tipped probe, the forward voltage was 3.3 V.

Then, the chip with the sapphire substrate side facing up was mounted on a substrate called a submount, and the submount with the chip mounted thereon was mounted in a TO-18 can package; when the light emission output was measured by a tester, the output at the applied current of 20 mA was 18 mW.

Comparative Example 1

A gallium nitride-based compound semiconductor light-emitting device was fabricated in the same manner as in the example 1, except that depressions/protrusions were not formed on the transparent material layer. When the fabricated light-emitting device was evaluated in the same manner as in the example 1, the forward voltage was the same at 3.3 V, but the light emission output was 8 mW.

Example 2

FIG. 11 is a schematic diagram showing a cross section of the gallium nitride-based compound semiconductor light-emitting device fabricated in this example, and its plan view is the same as that shown in the schematic diagram of FIG. 2 in the example 1. As in the example 1, a gallium nitride-based compound semiconductor layer (2) was formed on a sapphire substrate (1) by interposing therebetween a buffer layer (6) of AlN.

Figure 3:
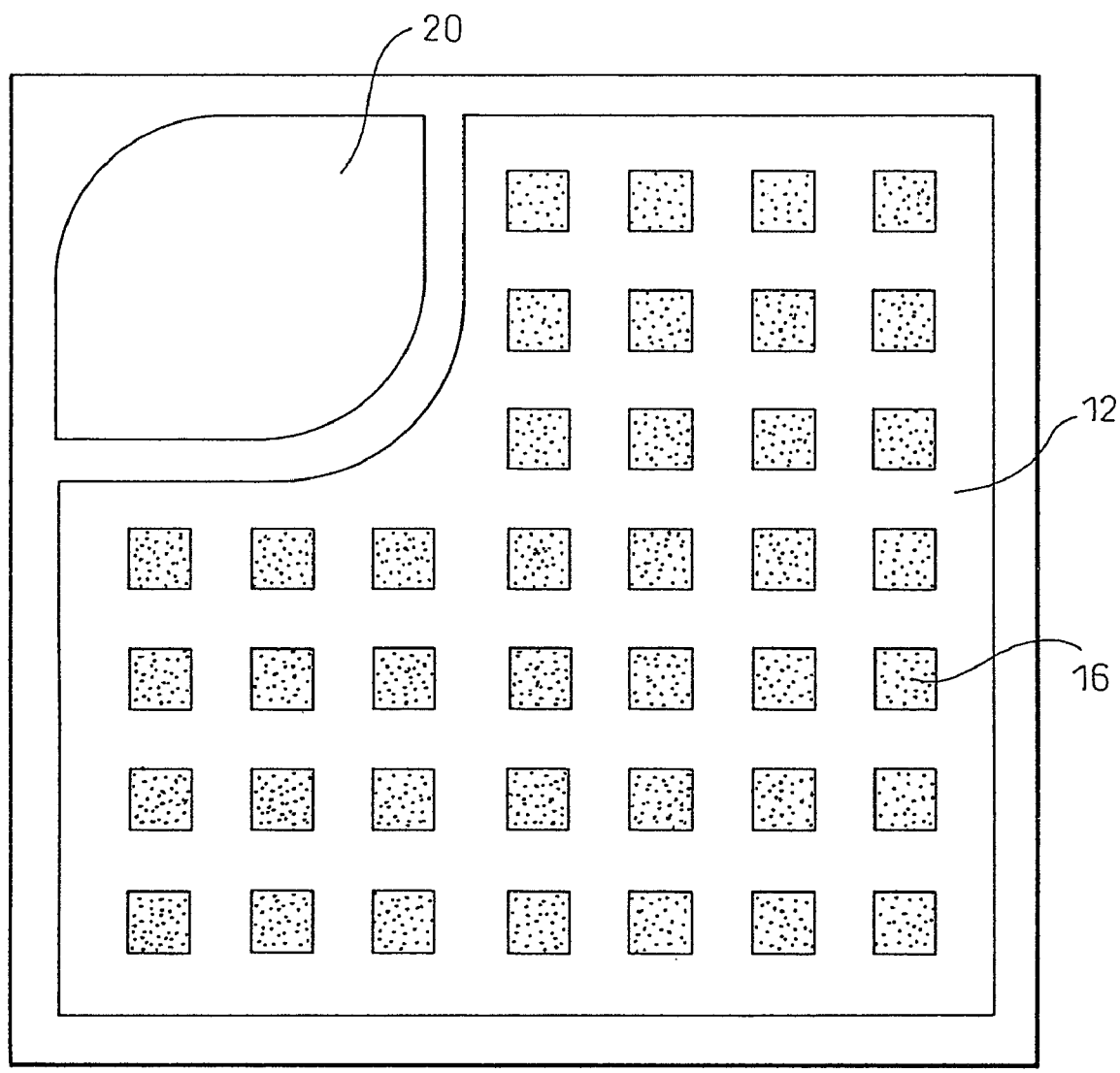
FIG. 3 is a schematic diagram showing a plan view of a transparent material layer in the gallium nitride-based compound semiconductor light-emitting device of the present invention fabricated in the examples 1 and 2.

The structure of the positive electrode in this example was as follows. The positive electrode (10) was formed on the p-type AlGaN contact layer by forming thereon a positive electrode contact layer (11) made of 20-nm thick ITO, a transparent material layer (12) made of 180-nm thick $SiO_2$, a reflective metal layer (13) made of 100-nm thick Ag, an overcoat layer (14) made of 500-nm thick Rh, and a bonding layer (15) of a five-layer structure of Au, Ti, Al, Ti, and Au (with thicknesses of 50 nm, 20 nm, 10 nm, 100 nm, and 200 nm, respectively). As in the example 1, protrusions having slanted surfaces were formed in a dot-like pattern on the transparent material layer (12) of $SiO_2$, as shown in FIG. 3; the height of each protrusion was 180 nm, the underlying positive electrode contact layer (11) were exposed in portions other than the dot-like protrusions and was thus made to contact the reflective metal layer (13).

As in the example 1, the negative electrode (20) of a two-layer structure of Ti and Au was formed on the n-type GaN contact layer. The light extracting face was located on the substrate side.

The positive electrode was fabricated in accordance with the following procedure. First, the portion of the n-type GaN contact layer on which the negative electrode was to be formed was exposed by reactive ion etching in the same manner as in the example 1.

Next, using known photolithographic and lift-off techniques, the positive electrode contact layer (11) of ITO and the transparent material layer (12) of $SiO_2$ were formed only on the area of the p-type AlGaN contact layer on which the positive electrode was to be formed. In forming the positive electrode contact layer and transparent material layer, the substrate was placed in a vacuum sputtering chamber, and an ITO film was formed to a thickness of 20 nm, followed by the formation of a $SiO_2$ film to a thickness of 180 nm.

After retrieving the substrate from the vacuum chamber, depressions/protrusions were formed on the transparent material layer.

First, using a known lithographic technique, a resist film was formed in a dot-like pattern. A positive resist in which the exposed areas dissolve when developed was used as the resist, and underexposed areas were created in the edge portions of the mask pattern by making the resist exposure time shorter than usual. By exposing this, a resist pattern having slanted edge surfaces was produced.

Dot-like protrusions having surfaces slanted relative to the substrate were formed by dry etching on the transparent material layer with the above-described resist pattern formed thereon. Each dot-like protrusion had a shape resembling a square pyramid with its vertex cut off, was trapezoidal in cross section, and had an upper surface 2 μm square and a lower surface 2.2 μm square. The height was about 180 nm, and the portions of the transparent material layer of $SiO_2$, except the portions where the protrusions were formed, were removed to expose the positive electrode contact layer of ITO. The protrusions were formed at intervals of 5 μm in directions parallel to the sides of the chip. The angle that the slanted surfaces of each dot-like protrusion made with the substrate was about 60 degrees.

After that, processing was performed in accordance with a procedure generally known as lift-off; then, using a similar technique, the reflective metal layer (13) of Ag was formed in such a manner as to completely cover the transparent material layer and the exposed positive electrode contact layer. The reflective metal layer was formed to a thickness of 50 nm by using an evaporation device.

Subsequently, the overcoat layer and the bonding pad layer were formed in the same manner as in the example 1. In this way, the positive electrode (10) was formed on the p-type AlGaN contact layer.

Next, the negative electrode was formed on the exposed n-type GaN contact layer in the same manner as in the example 1. After the substrate thickness was reduced to 85 μm by grinding and polishing the back surface of the substrate, the wafer with the positive and negative electrodes formed thereon was scribed from the semiconductor layer side by using a laser scriber, and then stressed and broken apart, thereby separating individual chips each 350 μm square.

When each chip was evaluated in the same manner as in the example 1, the forward voltage at the applied current of 20 mA was 3.4 V, and the light emission output was 19.5 mW.

INDUSTRIAL APPLICABILITY

Since the gallium nitride-based compound semiconductor light-emitting device of the present invention has excellent light extraction efficiency, a high-brightness LED lamp can be constructed from the light-emitting device, which is useful for lighting, display, and backlight applications.

The invention claimed is:

1. A gallium nitride-based compound semiconductor light-emitting device having a gallium nitride-based compound semiconductor layer structure comprising an n-type semiconductor layer, a light-emitting layer and a p-type semiconductor layer, on a substrate, wherein a positive electrode provided on the p-type semiconductor layer is a reflective positive electrode comprising a transparent material layer and a reflective metal layer formed on the transparent material layer, wherein the reflective metal layer is formed with depressions/protrusions on a surface thereof that faces the transparent material layer, and wherein the reflective metal layer covers an entire surface of the transparent material layer.

2. A gallium nitride-based compound semiconductor light-emitting device according to claim 1, wherein the transparent material layer contains an electrically conductive material.

3. A gallium nitride-based compound semiconductor light-emitting device according to claim 1, wherein the transparent material layer contains an electrically nonconductive material.

4. A gallium nitride-based compound semiconductor light-emitting device according to claim 2, wherein the transparent material layer is in contact with the p-type semiconductor layer and functions as a positive electrode contact layer.

5. A gallium nitride-based compound semiconductor light-emitting device according to claim 1, wherein a positive electrode contact layer is interposed between the transparent material layer and the p-type semiconductor layer.

6. A gallium nitride-based compound semiconductor light-emitting device according to claim 2, wherein the transparent material layer is formed from at least one material selected from the group consisting of ITO, $TiO_2$, ZnO, ZnS, $Bi_2O_3$, MgO, ZnAlO, and $SnO_2$.

7. A gallium nitride-based compound semiconductor light-emitting device according to claim 6, wherein the transparent material layer is formed from at least one material selected from the group consisting of ITO, ZnO, MgO, ZnAlO, and $SnO_2$.

8. A gallium nitride-based compound semiconductor light-emitting device according to claim 1, wherein the reflective metal layer is formed from at least one kind of metal selected from the group consisting of Ag, Al, Fe, Cr, Ti, Co, Ni, Pd, Os, Ru, Pt, Rh, and Ir, or from an alloy containing at least one of these metals.

9. A gallium nitride-based compound semiconductor light-emitting device according to claim 8, wherein the reflective metal layer is formed from at least one kind of metal selected from the group consisting of Ag, Al, Fe, Pt, Rh, and Ir, or from an alloy containing at least one of these metals.

10. A gallium nitride-based compound semiconductor light-emitting device according to claim 9, wherein the reflective metal layer is formed from at least one kind of metal selected between Ag and Al, or from an alloy containing at least either one of these metals.

11. A gallium nitride-based compound semiconductor light-emitting device according to claim 1, wherein the transparent material layer is formed with depressions/protrusions on a surface thereof that faces the reflective metal layer.

12. A gallium nitride-based compound semiconductor light-emitting device according to claim 1, wherein the depressions/protrusions are formed in a stripe pattern.

13. A gallium nitride-based compound semiconductor light-emitting device according to claim 1, wherein the depressions/protrusions are formed in a dot-like or lattice-like pattern.

14. A gallium nitride-based compound semiconductor light-emitting device according to claim 1, wherein the depressions/protrusions are formed in random shapes.

15. A gallium nitride-based compound semiconductor light-emitting device according to claim 1, wherein the depressions/protrusions are formed from curved surface.

16. A gallium nitride-based compound semiconductor light-emitting device according to claim 1, wherein the depressions/protrusions are formed from plane surface slanted relative to a substrate surface.

17. A gallium nitride-based compound semiconductor light-emitting device according to claim 16, wherein the slanted plane surface makes angles of 5 to 85 degrees relative to the substrate surface.

18. A gallium nitride-based compound semiconductor light-emitting device according to claim 1, wherein the depressions/protrusions have height differences of 0.01 μm to 10 μm.

19. A lamp comprising a gallium nitride-based compound semiconductor light-emitting device according to claim 1.

* * * * *